United States Patent [19]

Olson

[11] Patent Number: 4,476,432

[45] Date of Patent: Oct. 9, 1984

[54] WAVEFORM MEASUREMENT SYSTEM

[75] Inventor: David H. Olson, Hillsboro, Oreg.

[73] Assignee: Tektronix, Inc., Beaverton, Oreg.

[21] Appl. No.: 347,742

[22] Filed: Feb. 10, 1982

[51] Int. Cl.³ .................. G01R 13/20; H01J 29/52
[52] U.S. Cl. ........................... 324/121 R; 315/383;
324/77 A
[58] Field of Search .............. 328/255, 151; 324/77 A,
324/130, 121 R; 315/383; 364/487

[56] References Cited

U.S. PATENT DOCUMENTS 2,591,738  4/1952  Spencer .................... 315/383
3,771,056  11/1973 Zimmerman ............... 324/130

Primary Examiner—Ernest F. Karlsen
Assistant Examiner—E. Austin, II
Attorney, Agent, or Firm—George T. Noe

[57] ABSTRACT

A waveform measurement system includes a feature in which a readout of an absolute ground-reference voltage at a particular selectable time point along a waveform is provided. A ground reference potential is sampled and stored, and the instantaneous voltage value of the waveform at the time point is arithmetically combined with the reference potential to provide the measurement. Intensified dots, as well as horizontal volts cursors, are generated and displayed on the waveform at the ground reference and selected instantaneous voltage value positions.

7 Claims, 2 Drawing Figures

WAVEFORM MEASUREMENT SYSTEM

BACKGROUND OF THE INVENTION

In waveform display instruments, such as oscilloscopes, a popular user convenience feature is the use of cursors for making differential time and voltage measurements. Such cursors are typically in the form of horizontal or vertical lines, or even intensified dots, which may be positioned independently to points of interest along a waveform. One such system employing two intensified dots is taught in U.S. Pat. No. 3,881,133, which is assigned to the assignee of the present invention. Here a linear potentiometer with an associated calibrated readout dial permits one dot to be moved along a waveform with respect to the other dot while providing a readout of the time difference.

An extension of the two-dot time measurement system is the coupling of volts cursors in the form of horizontal lines to the time dots so that a voltage difference may be read out between the two times.

It would be desirable to provide a user-convenience feature in which the readout is an absolute ground-referenced voltage at a particular selectable time along the waveform.

SUMMARY OF THE INVENTION

In accordance with the present invention, a waveform measurement system affords a provision similar to a strobing voltmeter function on an oscilloscope by forcing a first horizontal cursor to a ground reference and allowing a second horizontal cursor to track the time position along a displayed waveform. The ground reference is obtained by sampling absolute ground and storing the result in memory. In a digital oscilloscope this may be achieved directly via a ground connection to the signal acquisition system. The instantaneous signal waveform values are made with respect to ground, so it is a matter of displaying the ground reference and waveform in proper perspective with each other. At any selectable point along the waveform, as indicated by an intensified dot superimposed thereon, the instantaneous voltage or amplitude value is sampled and stored in a memory. The stored amplitude and ground reference values may then be applied to a digital voltmeter circuit which calculates and displays the ground-referenced voltage in alpha-numeric form.

It is therefore one object of the present invention to provide a waveform measurement system which permits measurement of an absolute ground referenced voltage at any selectable point along a waveform.

It is another object of the present invention to provide a waveform measurement system in which first and second horizontal voltage cursors are coupled respectively to a ground reference intensified dot and an intensified time dot which is variably adjustable along a waveform.

Other objects, features, and advantages of the present invention will become apparent to those skilled in the art upon a reading of the following description when taken in conjunction with the accompanying drawings.

DETAILED DESCRIPTION OF THE INVENTION

Figure 1:
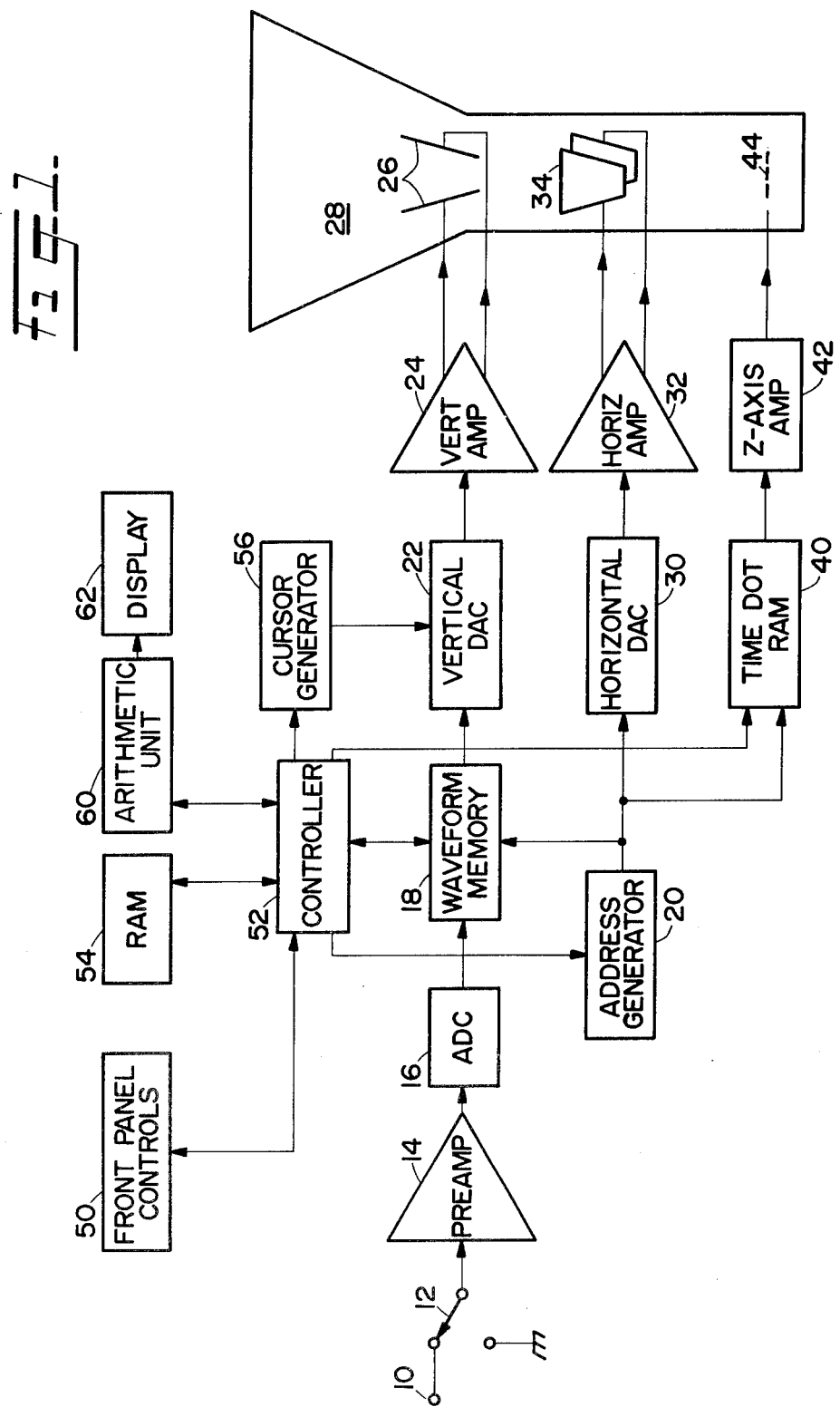
FIG. 1 is a block diagram of a waveform measurement system in accordance with the present invention.

Turning now to FIG. 1 of the drawings, there is shown a block diagram of a digital oscilloscope embodying the waveform measurement system of the present invention. An input signal to be displayed is applied via an input terminal 10 and through the closed contacts of a switch 12 to preamplifier 14. The preamplified signal is then applied to an analog-to-digital converter (ADC) 16, which quantizes or digitizes the signal for storage in a waveform memory 18 in accordance with conventional digital oscilloscope signal acquisition techniques. The stored waveform is subsequently read out of the waveform memory 18 under the control of address signals from an address generator 20 and applied to a digital-to-analog converter (DAC) 22, which reconstructs the analog signal. The reconstructed analog signal is converted by vertical amplifier 24 to a push-pull signal of suitable amplitude to drive a pair of vertical deflection plates 26 of a cathode-ray tube 28. The address signal from address generator 20 is a progressive count signal, and thus may be used to provide the horizontal, or time-base, drive. DAC 30 converts the address count signal to an analog ramp, which is converted by horizontal amplifier 32 to a push-pull signal of suitable amplitude to drive a pair of horizontal deflection plates 34. Thus far described is a conventional digital oscilloscope, including conventional acquisition and display circuits.

The system also includes a time-dot random access memory (RAM) 40 which is driven by the address count signal, and when an address location therein containing a time-dot bit reached, that bit is read out and applied to a Z-axis amplifier circuit 42, which in turn steps up the voltage on the cathode-ray tube grid 44 to momentarily increase beam current, resulting in an intensified dot superimposed on the displayed waveform at the time position corresponding to the memory location of the time dot. The particular memory locations for one or more time dots may be selected by an operator via appropriate front-panel controls and associated circuits 50 and routed to RAM 40 by a controller 52, which also causes the address generator 20 to select the correct address for storage.

Controller 52 may suitably be a commercially-available microprocessor implemented along with an associated RAM 54 to control and orchestrate various system functions, as will be seen. A cursor generator 56 is provided to produce one or more horizontal cursors on the display. The output of the cursor generator 56 is applied to the vertical DAC 22 to be converted to a voltage level for display as a horizontal line. The cursor information may be provided by either the front-panel controls 50 or the waveform memory 18 and temporarily stored in RAM 54 or transferred directly by controller 52 to the cursor generator 56. In the case of coupled cursors, i.e., cursors coupled to the time dots, the controller 52 reads the waveform memory 18 at the time positions of the time dots and transfers the contents of those memory locations to the RAM 54. Thus, for two time dots, two coupled cursors may be generated, and further, since the cursors represent the voltage amplitudes at the two respective time positions on the waveform, the voltage differential may be easily calculated by an arithmetic unit 60 and displayed in a digital display device 62, such as a liquid crystal display or a light-emitting diode display.

To make absolute ground-referenced voltage measurements, switch 12 is placed in the ground position, establishing ground potential at the input of preamplifier 14. The ground potential is converted to digital representations by ADC 16 and stored in the waveform memory 18. The controller 52 selects one or more of the stored ground representations and transfers such ground representations to RAM 54. Thereafter, switch 12 is returned to the signal path connection, connecting the input of preamplifier 14 to input terminal 10, and allowing the waveform memory 18 to be filled with an acquired waveform. The controller 52 then places a time-dot bit in the time-dot RAM 40 in a memory location which corresponds to the display start at the left edge of the viewing screen. The first time dot then becomes the ground dot in the display.

Figure 2:
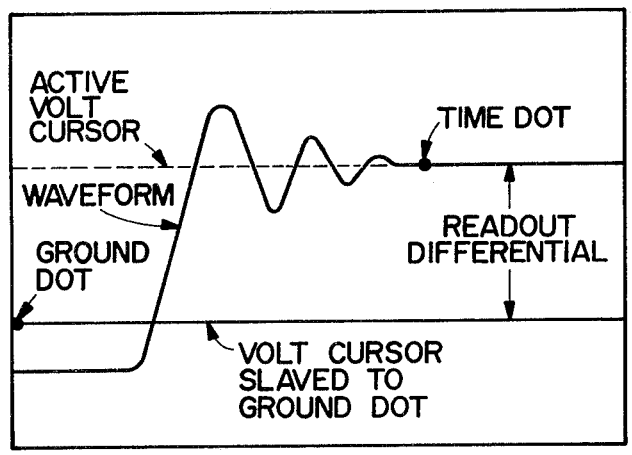
FIG. 2 is a typical oscilloscope display showing the measurement feature of the present invention.

Refer to FIG. 2 for discussion of the display. The controller 52 transfers the ground reference representation from RAM 54 to the cursor generator 56. Thus the ground dot may be generated at the viewing screen left edge in accordance with the beam intensification produced by reading the stored bit out of the time-dot RAM 40 and activating the Z-axis amplifier 42, and then as the normally-intensified beam progresses from left to right across the viewing screen, a cursor is drawn at the ground reference position. The waveform may then be read out of waveform memory 18, converted to analog form by DAC 22 and displayed. The second time dot may be moved along the waveform by means of the front panel controls 50 to a point of interest. Since the time position of the time dot corresponds to an address from address generator 20, the controller 52 may read the contents of waveform memory 18 at the time position, and the waveform amplitude at the time-position point may be stored in RAM 54 along with the ground reference. Thereafter, the active volt cursor may be generated at the amplitude position of the intensified dot, and the waveform amplitude and ground reference levels may be transferred from RAM 54 to arithmetic unit 60 for calculation of the amplitude with reference to ground and displayed by display unit 62. The controller 52 may suitably include a high-speed clock, for example, 10 megahertz, for operating the address generator 20 and controlling the various functions, so that changes in the display appear smooth and continuous to the viewer.

It should be noted that in actual practice, waveform memory 18 could be separated into independent acquisition and display memories, and the ground reference information could be stored in display memory along with one or more waveforms. In addition, when the ground reference is acquired via switch 12, several samples may be taken and averaged to establish the ground reference for display. Such a system as described hereinabove may be quite flexible, and it would be obvious to one having ordinary skill in the art that many changes may be made in the details of the above-described preferred embodiment of the invention without departing from the spirit of the invention in its broader aspects. Therefore, the scope of the invention should be determined by the following claims.

What I claimed as being novel is:

1. A waveform measurement system, comprising:
   input means for selectively receiving and storing a time-varying electrical signal and a ground reference potential;
   means for providing a waveform display of said signal;
   means for selecting a time point along said waveform, an instantaneous voltage value being associated with said time point;
   means for calculating the voltage difference between said instantaneous voltage value and said stored ground reference potential; and
   means for providing a readout display of said voltage difference.

2. A system in accordance with claim 1 further comprising means for providing with said waveform display a display of said ground reference potential at its relative position with respect to said waveform.

3. A system in accordance with claim 2 wherein said means for providing a display of said ground reference potential comprises a circuit for generating an intensified dot at the relative ground position.

4. A system in accordance with claim 3 further comprising a cursor generator for producing volts cursors passing through said ground reference potential and said instantaneous voltage value of said selected time point.

5. A system in accordance with claim 1 wherein said input means includes means for converting said time-varying electrical signal and said ground reference potential to digital representations, and memory means for storing said representations.

6. A system in accordance with claim 5 wherein said memory means comprises a digital memory havintg predetermined addressable storage locations associated with time positions of said waveform display, and said means for selecting a time point along said waveform includes means for selecting the addressable storage location of said memory associated with said time point.

7. A system in accordance with claim 6 further comprising a time dot memory for storing time dot indicators at preselected address locations, and circuit means coupled to said time dot memory for receiving said time dot indicators and generating display markers in response thereto.

* * * * *